(12) United States Patent
Lesea

(10) Patent No.: US 8,014,184 B1
(45) Date of Patent: Sep. 6, 2011

(54) RADIATION HARDENED MEMORY CELL

(75) Inventor: Austin H. Lesea, Los Gatos, CA (US)

(73) Assignee: Xilinx, Inc., San Jose, CA (US)

(*) Notice: Subject to any disclaimer, the term of this patent is extended or adjusted under 35 U.S.C. 154(b) by 170 days.

(21) Appl. No.: 12/558,770

(22) Filed: Sep. 14, 2009

(51) Int. Cl.
*G11C 5/06* (2006.01)

(52) U.S. Cl. .................. 365/63; 365/51; 365/154

(58) Field of Classification Search .............. 365/63, 365/51, 154; 257/E27.098–E27.099
See application file for complete search history.

(56) References Cited

U.S. PATENT DOCUMENTS

| | | | |
|---|---|---|---|
| 5,570,313 | A | 10/1996 | Masson et al. |
| 5,889,315 | A | 3/1999 | Farrenkopf et al. |
| 6,727,573 | B2 | 4/2004 | Mitani et al. |
| 6,735,110 | B1 | 5/2004 | Lesea |
| 6,809,957 | B2 | 10/2004 | Lesea |
| 6,914,804 | B2 | 7/2005 | Lesea |
| 7,139,190 | B1 | 11/2006 | de Jong |
| 7,236,000 | B1 | 6/2007 | Steiner |
| 7,268,400 | B2 | 9/2007 | Cecchi et al. |
| 7,271,452 | B2 | 9/2007 | Arai |
| 7,298,168 | B1 | 11/2007 | Steiner |
| 7,515,452 | B1 | 4/2009 | de Jong et al. |
| 7,738,285 | B2 * | 6/2010 | Nii ................ 365/154 |
| 2003/0151956 | A1 | 8/2003 | Marr et al. |
| 2006/0056220 | A1 | 3/2006 | Roche et al. |
| 2006/0086989 | A1 | 4/2006 | Lee et al. |
| 2007/0013425 | A1 | 1/2007 | Burr et al. |

OTHER PUBLICATIONS

U.S. Appl. No. 11/649,447, filed Jan. 3, 2007, de Jong et al.
U.S. Appl. No. 11/649,448, filed Jan. 3, 2007, de Jong et al.
U.S. Appl. No. 11/900,549, filed Sep. 11, 2007, Lesea.
U.S. Appl. No. 12/045,864, filed Mar. 11, 2008, Lesea.
U.S. Appl. No. 12/354,202, filed Jan. 15, 2009, de Jong.
Rizzo, Giuliana, *R&D on silicon pixels and strips*, SuperB WorkShop, Nov. 17, 2006, pp. 1-17, Frascati National Laboratories, Frascati, Rome.
Rossi, Roberto et al., "Model and Verification of Triple-Well Shielding on Substrate Noise in Mixed-Signal CMOS ICs," *Proc. of the 29th European Solid-State Circuits Conference*, Sep. 16, 2003, pp. 643-646, IEEE, Piscataway, New Jersey, USA.
Velazco, R. et al., "Two CMOS Memory Cells Suitable for the Design of SEU-Tolerant VLSI Circuits" *IEEE Transactions on Nuclear Science*, Dec. 1994, pp. 2229-2234, vol. 41, No. 6, IEEE, Piscataway, New Jersey, USA.
Zhang, Ming et al., "Design of Soft Error Tolerant Logic Circuits," *Proc. of the Workshop on System Effects of Soft Logic Errors*, Apr. 5, 2005, pp. 1-4, Univ. of Illinois, Urbana-Champaign, Illinois, USA.

* cited by examiner

*Primary Examiner* — David Lam
(74) *Attorney, Agent, or Firm* — Scott Hewett

(57) ABSTRACT

A memory cell has a data value storage circuit and a data address circuit that includes a first address transistor formed in a first address transistor well and a second address transistor formed in a second address transistor well. The first address transistor is coupled between a data node and the second address transistor, and the second address transistor is coupled between the first address transistor and the data value storage circuit. The first address transistor well is coupled to an intermediate node between the first address transistor and the second address transistor, and the second address transistor well is coupled to a ground terminal.

18 Claims, 7 Drawing Sheets

RADIATION HARDENED MEMORY CELL

FIELD OF THE INVENTION

This invention relates generally to complementary metal-oxide-semiconductor ("CMOS") memory cells and more particularly to memory circuits tolerant to high energy particle ("ion") hits.

BACKGROUND

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

PLDs and other ICs that are specialized to be radiation tolerant are desirable for certain applications. Such ICs are often referred to as single event upset (SEU) tolerant ICs, heavy ion tolerant (HIT) ICs or radiation-hardened ICs. An SEU arises when a heavy ion or high-energy particle, such as an alpha particle or neutron, hits a memory cell, charging internal nodes of the memory cell that can change the memory state. For convenience of discussion, an SEU will be referred to as an "ion hit," whether it involves an ion or other high-energy particle causing the error.

Various approaches have been tried to improve SEU tolerance. One approach is commonly called "resistive hardening;" however, resistive hardening can significantly degrade latch performance. Another disadvantage arises if a standard CMOS fabrication has to be modified to accommodate a resistively hardened IC. It is highly desirable that SEU tolerant ICs be made using standard CMOS fabrication processes.

Another approach to improve SEU tolerance is commonly called "design hardening." Design hardening generally refers to laying out a memory cell or other circuit to improve recovery of data after ion hits. A general discussion of design hardening is found in the paper entitled Two CMOS Memory Cells Suitable for the Design of SEU-Tolerant VLSI Circuits, by Velazco et al., IEEE Transactions on Nuclear Science, Vol. 41, No. 6 (December 1994), the disclosure of which is hereby incorporated by reference for all purposes.

In design hardening, redundant storage bits are located apart from each other, maintaining a source of initial data after an SEU upsets one of the storage bits. Many variations are known, using sixteen-, fourteen- and twelve-transistor SEU tolerant memory cells.

FIG. 1 is a circuit diagram of a prior art twelve-transistor SEU tolerant memory cell 150. As used herein, "twelve-transistor memory cell" refers to both the storage devices N1, N2, N3, N4, P1, P2, P3, P4 and the access devices T1, T2, T3, T4. Those of skill in the art of SEU resistant memory cells appreciate that the number of access devices is not always included in the transistor count or shown in the memory cell circuit diagram. The operation of the memory cell 150 will be familiar to those of skill in the art. A detailed description of a similar SEU resistant memory cell is described in U.S. Pat. No. 5,570,313 by Masson et al. and in U.S. Patent Application No. 2006/0056220 A1 by Roche et al., the disclosures of which are incorporated herein by reference for all purposes. A detailed description of the electrical operation of the circuit is therefore omitted.

The memory cell circuit 150 has data terminals d, $d_b$ ("data BAR"), output terminals Q, $QQ_b$, and internal nodes 152, 154 that store values $Q_b$ and QQ, respectively. A data value is a digital zero or digital one value, and the bar value is the opposite value. For example, if Q=1, then $Q_b$=0. QQ saves a redundant value of Q, and $QQ_b$ saves a redundant value of $Q_b$. The values stored at the nodes are utilized in restoring the state of the memory cell if a node is upset by an SEU.

Since QQ has the same value of Q, and $QQ_b$ has the same value of $Q_b$, other nodes could be used for the outputs of the memory cell 150. For example, instead of Q and $QQ_b$ being the nodes that are output, as shown in FIG. 1, the outputs could be nodes QQ and $QQ_b$, nodes Q and $Q_b$, or nodes QQ and $Q_b$. Furthermore, in a memory array having several similar memory cells defined in the silicon layer, some memory cells in the array may interface to other portions (circuits) of an IC through nodes Q and $Q_b$, and other memory cells may interface to other portions or the IC through nodes QQ and $Q_b$, for example.

Redundant data storage nodes are used for storing information. If data stored in one node is changed by an ion hit, the redundant node restores the other node to its initial value (state). This protects the data stored in the memory cell from ion hits as long as the data values stored in both of the redundant nodes are not simultaneously changed by an ion hit. It is desirable to physically separate redundant nodes to avoid both nodes from being affected by a single ion hit.

An ion hit creates charge in the silicon of the memory cell. This charge can upset the data value stored at a node by changing the voltage at that node. As the devices used in memory cells shrink, the amount of charge required to upset a stored data value also decreases. Charge is generated about a radius of the path of the ion. Although this charge radius depends on the energy of the ion, it is generally desirable to separate redundant nodes in SEU tolerant memory cells by at least one micron.

As the design technology decreases for IC production, simply separating redundant nodes may not provide sufficient SEU tolerance. Even when redundant nodes in SEU tolerant memory cells are separated by at least one micron, higher energy ions might upset the data value stored in a memory cell.

Therefore, memory cells with improved SEU tolerance are desirable.

SUMMARY

A memory cell has a data value storage circuit and a data address circuit that includes a first address transistor formed in a first address transistor well and a second address transistor formed in a second address transistor well. The first address transistor is coupled between a data node and the second address transistor, and the second address transistor is coupled between the first address transistor and the data value storage circuit. The first address transistor well is coupled to an intermediate node between the first address transistor and the second address transistor, and the second address transistor well is coupled to a ground terminal.

In some embodiments, the data value storage circuit can be a self-correcting data storage circuit. The data value storage circuit can include a first CMOS pair cross-coupled with a second CMOS pair. The address control line can be a word line or a memory array. The memory cell can also include an output node, the data value storage circuit being disposed between the output node and the data address circuit.

In some embodiments, the memory cell can also include an inverse node (i.e., an inverse data node) and a second data address circuit. The second data address circuit includes a third address transistor formed in a third address transistor well and a fourth address transistor formed in a fourth address transistor well. The third address transistor is coupled between the inverse node and the fourth address transistor. The fourth address transistor is coupled between the third address transistor and the data value storage circuit. Each of the third address transistor and the fourth address transistor is controlled by the address control line. The third address transistor well is coupled to a second intermediate node between the third address transistor and the fourth address transistor. The fourth address transistor well is coupled to a ground terminal. The data node can be coupled to a bitline of a memory array and the inverse node is coupled to an inverse bitline of the memory array.

The data node can be a data input node and the inverse node can be an inverse input node, where the memory cell further comprises a data output node coupled to the data value storage circuit and an inverse output node coupled to the data value storage circuit. The data output node can provide a data value stored in the data value storage circuit, and the inverse output node can provide an inverse data value stored in the data value storage circuit.

The data value storage circuit can be a self-correcting data storage circuit. The self-correcting data storage circuit can restore the data value after a single-event upset. The self-correcting data storage circuit can include a plurality of transistors coupled to restore the data value to the data output node of the memory cell to an initial value following an event upsetting the initial value. The plurality of transistor can include at least first, second, third, and fourth transistors. The first transistor can be of a first type in a first well of a second type having a first well tap. The second transistor can be of the first type in a second well of the second type having a second well tap. The third transistor of the second type in a third well of the first type having a third well tap. The fourth transistor of the second type in a fourth well of the first type having a fourth well tap. The first well, second well, third well, and fourth well are isolated from each other.

When the data value storage circuit is a self-correcting data storage circuit, the memory cell can further include fifth, sixth, seventh, and eighth transistors. The fifth transistor can be of the first type in a fifth well of the second type having a fifth well tap. The sixth transistor can be of the first type in a sixth well of the second type having a sixth well tap. The seventh storage transistor can be of the second type in a seventh well of the first type having a seventh well tap. The eighth storage transistor can be of the second type in an eighth well of the first type having an eighth well tap. The fifth well, sixth well, seventh well and eighth well can be isolated from each other and from each of the first well, the second well, the third well and the fourth well.

In some embodiments, the first transistor, the second transistor, the third transistor, and the fourth transistor can be coupled to operate as a first inverter circuit. The fifth transistor, the sixth transistor, the seventh transistor, and the eighth transistor can be coupled to operate as a second inverter circuit. The first inverter can be cross-coupled to the second inverter so as to restore the data value to the node of the memory cell to the initial value following the event upsetting the initial value.

According to another aspect, a method of operating a memory cell includes providing a memory cell having an address circuit, the address circuit including a first address transistor in a first address transistor well and a second address transistor in a second address transistor well, the first and second address transistors being coupled in series between a data node and a data value storage circuit. The first address transistor well is coupled to an intermediate node between the first address transistor and the second transistor, and the second address transistor well is coupled to a ground terminal. The method also includes turning on the first address transistor and the second address transistors, writing a data value to the data value storage circuit, turning off the first address transistor and second address transistors, and exposing the memory cell to ionizing radiation. Exposing the memory cell to ionizing radiation creates charge in one of the first address transistor well or the second transistor well, the charge being isolated to one of the first address transistor well or the second address transistor well so as to not disturb the data value.

In some embodiments, the first address transistor is coupled between the data node and the second address transistor, the second address transistor is coupled between the first address transistor and the data value storage circuit, each of the first address transistor and the second address transistor are controlled by an address control line, the first address transistor well is coupled to an intermediate node between the first address transistor and the second address transistor, and the second address transistor well is coupled to a ground terminal.

In some embodiments, the charge is created in the first address transistor well and applied to the intermediate node so as to hold the second address transistor in a non-conductive state.

DETAILED DESCRIPTION

An Exemplary FPGA

Figure 2:
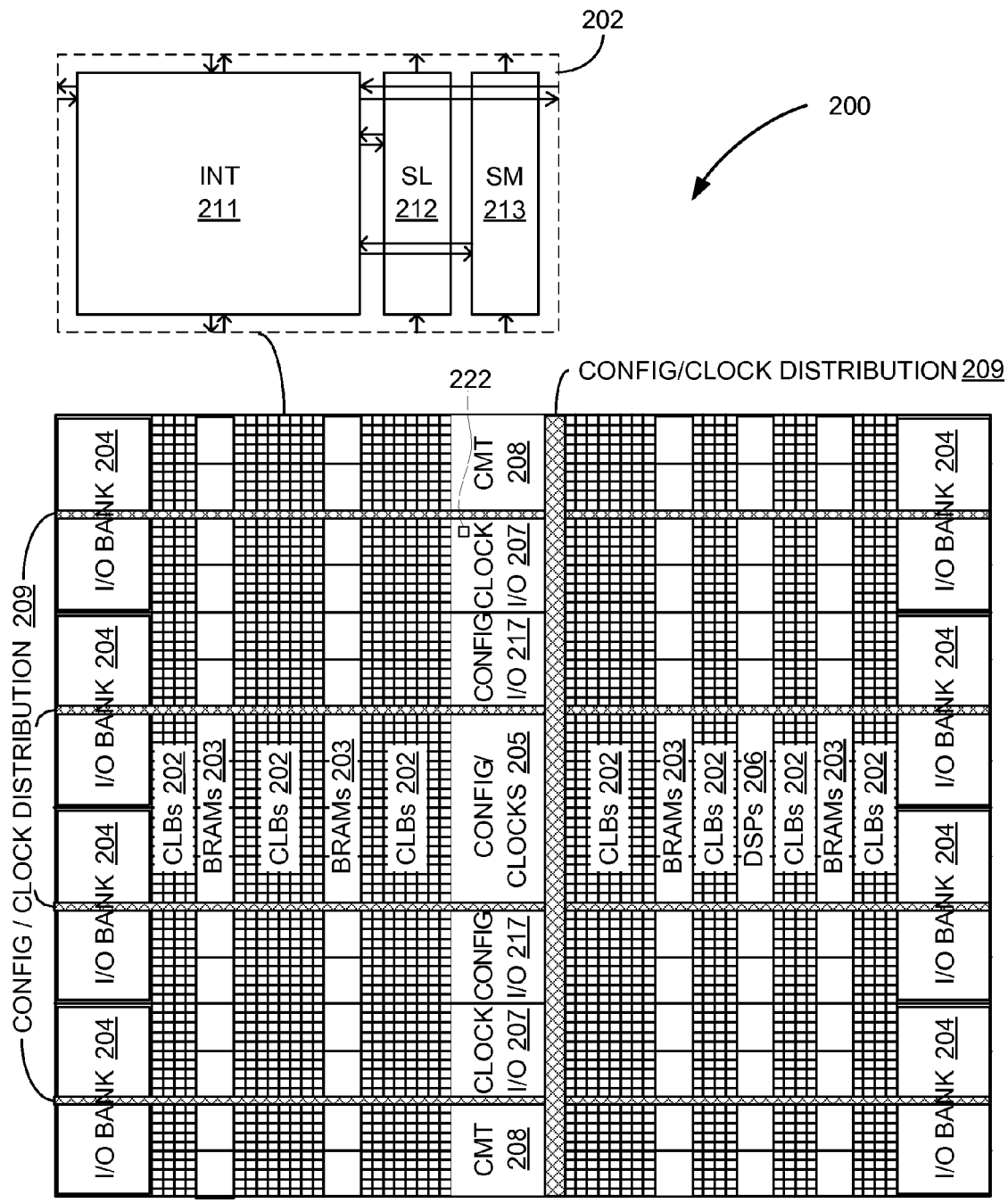
FIG. 2 is a plan view of an FPGA architecture including embodiments of the invention.

FIG. 2 illustrates an FPGA architecture 200 including one or more embodiments of the invention. The FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An 10B 204 can include, for example, two instances of an input/output logic element (IOL 215) in addition to one instance of the programmable interconnect element (INT 211). As will be clear to those of skill in the art, the actual I/O pads coupled, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Embodiments of the invention are incorporated in any of several portions of the FPGA 200, such as memory arrays, registers, flip-flops and latches. For example, memory cells with SEU-tolerant address circuits and memory arrays according to one or more embodiments 222 are incorporated in BRAMs or configuration memory. Configuration memory is distributed throughout an FPGA and is generally present in numerous types of programmable blocks, such as CLBs and IOs. Some types of memory, such as block memory, use error code correction techniques, and are less susceptible to SEU errors. Non-correcting memory cells are suitable for many applications in an FPGA, and SEU-tolerant address circuits according to embodiments improve SEU tolerance for such memory circuits, as well as self-correcting memory.

The configuration memory cells in an FPGA are used to control the operation of other circuits. Within the FPGA, the memory cells are placed in columns, where there could be groups of 1, 2, or 3 columns separated by circuits controlled by the memory cells. Memory cell outputs can connect to the circuits using poly or metal layers.

Configuration memory is particularly susceptible to SEU because error code correction techniques cannot be used, and an error in configuration memory can change the functionality of a block in the FPGA. In a particular embodiment, the FPGA 200 is fabricated using serial pass gate techniques according to one or more embodiments. It is particularly challenging to provide SEU tolerant memory for small technology designs because as the design technology decreases, the separation between nodes of a memory cell decreases. The amount of charge needed to upset a data value stored at a node also typically decreases. Memory cells using serial address transistors according to embodiments provide SEU tolerance, even in small technology designs.

Exemplary Memory Cells

Figure 3A:
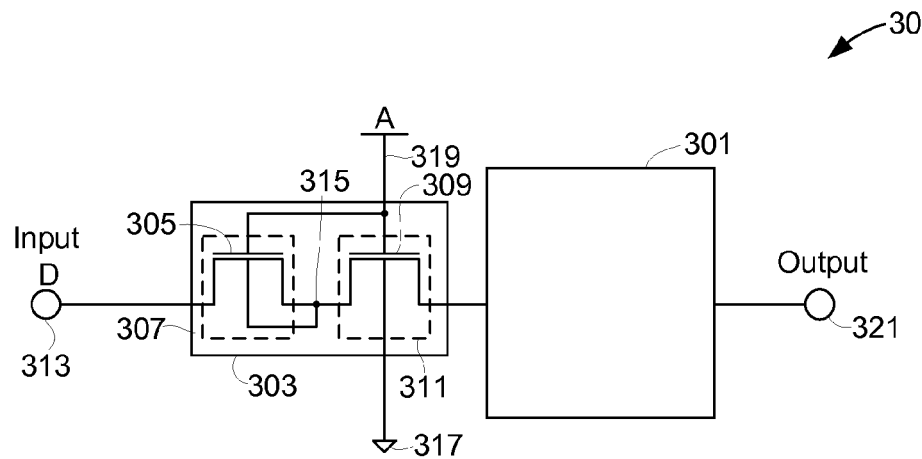
FIG. 3A is a layout of a memory cell 300 according to an embodiment of the invention.

FIG. 3A is a layout of a memory cell 300 according to an embodiment of the invention. The memory cell 300 has a data value storage circuit 301 and an address circuit 303. In a particular embodiment, the data value storage circuit 301 is a self-correcting data storage circuit designed to restore the data value after an SEU (see, e.g., FIG. 3B). In alternative embodiments, the data value storage circuit 301 is an RAM or SRAM-type circuit (see, e.g., FIG. 3C). Embodiments are used in latches, registers, flip-flops, and master-slave circuits, as well as memory bits and memory arrays, and may have dual or single inputs, and dual or single outputs.

The address circuit 303 has a first address NMOS transistor 305 fabricated in a first address transistor well 307 and a second address NMOS transistor 309 fabricated in a second address transistor well 311 in series between a data input node 313 and the data value storage circuit 301. The first address transistor well 307 is coupled to a node 315 between the first address NMOS transistor 305 and the second address NMOS transistor 309. The second address transistor well 311 is coupled to a ground terminal 317. The first and second address transistors 305, 309 are controlled by an address control line 319 (e.g., a word line in a memory array) coupled to their respective gate terminals. The data value stored in the data value storage circuit 301 is provided to a data output node 321. In some embodiments, the input 313 and output 321 are coupled to a common line, such as a bitline in a memory array. Alternative embodiments use single-input, dual output memory cells and dual-input, dual output memory cells. Dual output memory cells typically provide data and data-bar values that improve differentiation (i.e., READ operation) between data states (e.g., data ZERO and data ONE).

The series address transistors provide protection against a data value stored in the data value storage circuit from being corrupted if the access transistor path is hit by a high-energy particle by collecting the generated charge into a single well, where it affects a only single device. It is less likely that a single high-energy particle will "turn on" both address transistors and corrupt the stored data value (e.g., by discharging the data value storage circuit to a bitline), whereas a single high-energy particle might cause a soft error disturb in a conventional, single-transistor access circuit.

Figure 1:
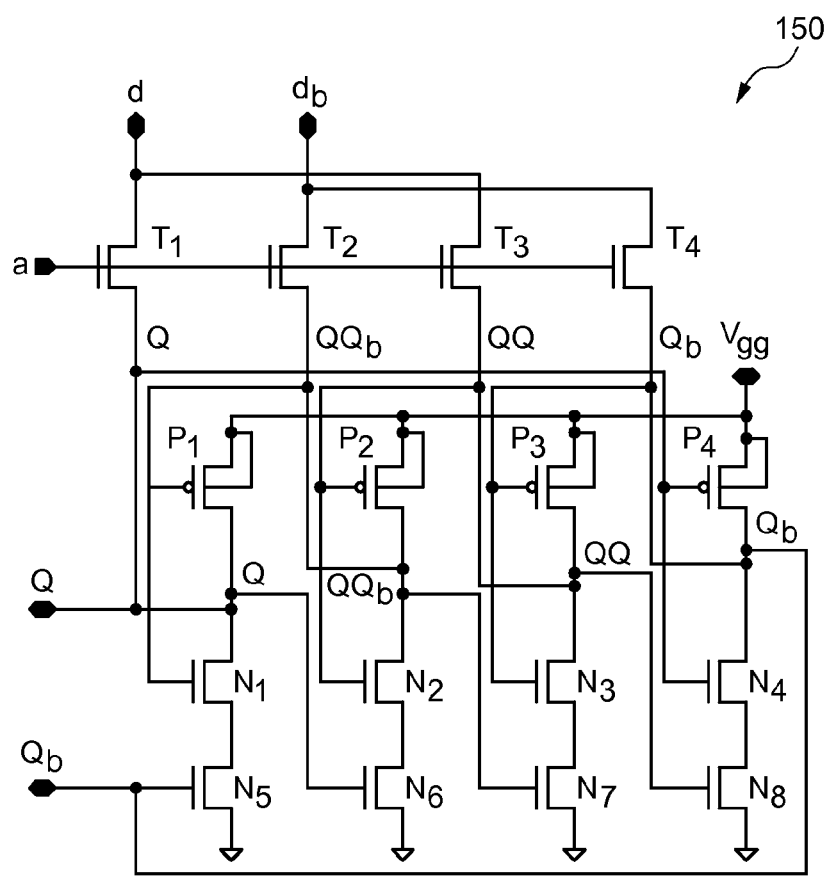
FIG. 1 is a circuit diagram of a prior art twelve-transistor SEU tolerant memory cell.
Figure 3C:
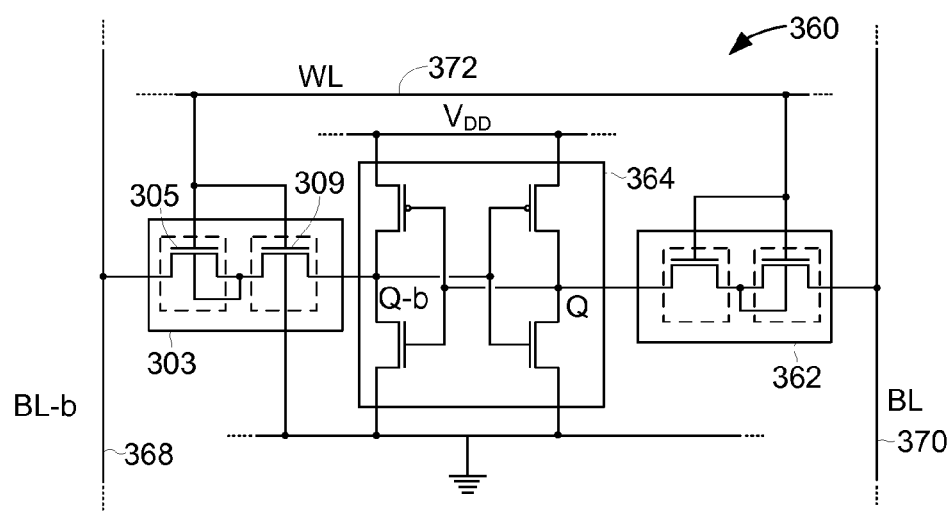
FIG. 3C is a layout of an RAM-type memory cell according to an embodiment of the invention.
Figure 3B:
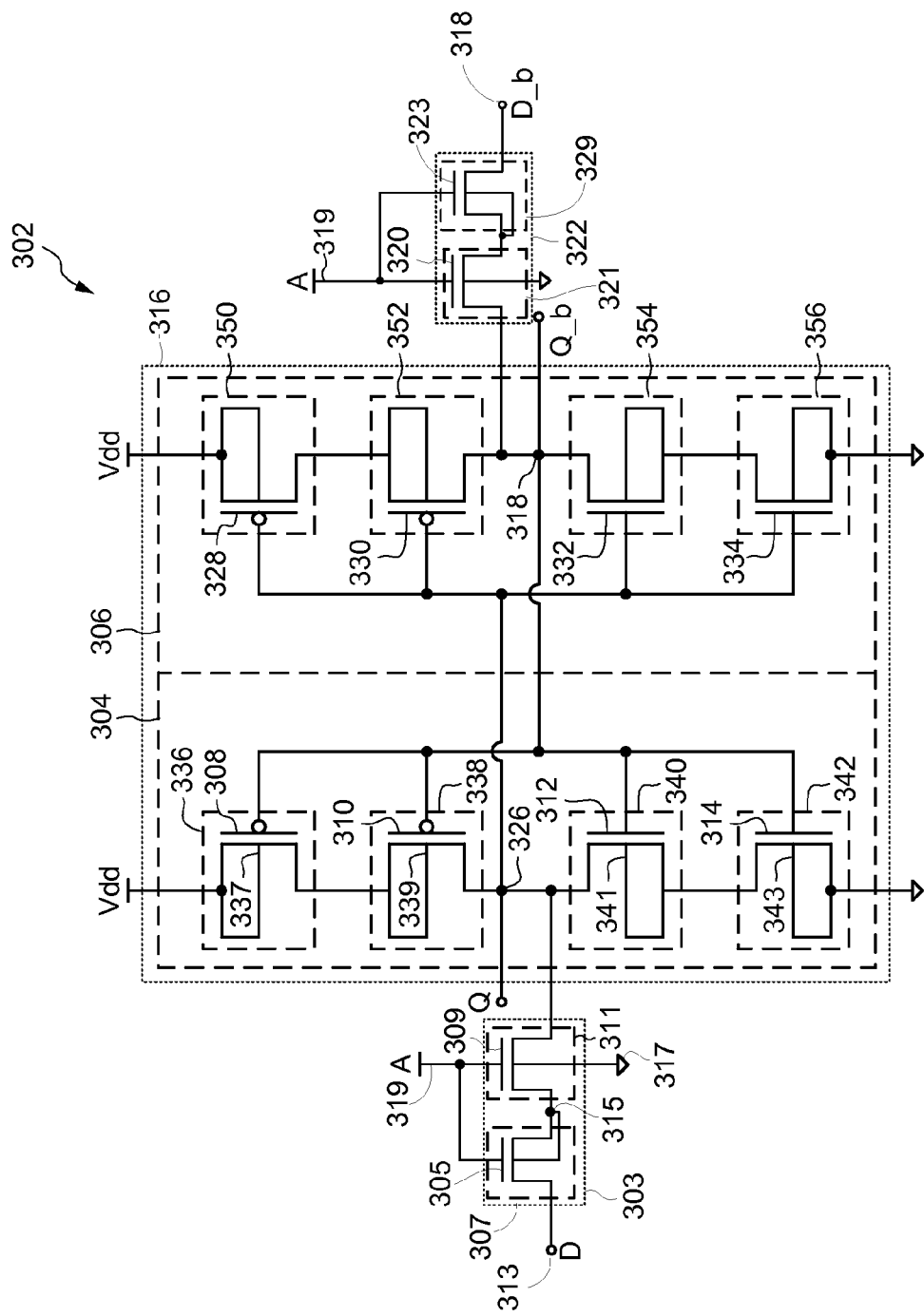
FIG. 3B is a layout of an SEU tolerant memory cell according to an embodiment of the invention.

FIG. 3B is a layout of an SEU tolerant memory cell 302 according to an embodiment of the invention. The memory cell 302 has an address circuit 303 coupled to a data value storage circuit 316 that includes a plurality of transistors coupled to restore a data value (e.g., a digital "1" or a digital "0") to a node (e.g., Q) of the memory cell to an initial value following an event upsetting the initial value. The memory cell 302 has a first inverter 304 and a second inverter 306 that is cross-coupled to the first inverter 304 to provide redundant memory storage. The second inverter 306 operates similarly to the first inverter 304. For simplicity of discussion, only the operation of the first inverter will be described in detail, as operation of the second inverter and of the SEU-tolerant memory cell 302 will be familiar to those of skill in the art of SEU-tolerant memory, particularly in light of FIG. 1 and its associated description, above.

The memory cell 302 forms a portion of a memory cell array in an IC, such as in an FPGA, or is used in a functional element such as a register, latch, flip-flop, or master-slave data flip-flop. In a particular embodiment, memory cells are stepped in a repeated fashion to form a memory array having thousands of memory cells. The first inverter 304 has two transistors of a first type 308, 310 (e.g., PMOS transistors) in series and two transistors of a second type 312, 314 (e.g., NMOS transistors) in series. As used herein, "type" refers to the conductivity type, such as N-type or P-type semiconductor material, or PMOS or NMOS type transistors.

Data D is provided to a first input node 313 through a first address transistor 305 in series with a second address transistor 309, both of which are controlled by address control line 319. Inverse data ("data-bar") D_b is provided to a second input node (inverse data input node or "inverse input node") 318 and coupled to the data value storage circuit 316 through a third address transistor 323 and a fourth address transistor 320 in a second address circuit 322. The second input node 318 is coupled to the gates of the four transistors 308, 310, 312, 314 in the first inverter 304, and the first input node 313 is coupled to the gates of the four transistors in the second inverter 306. Thus, a data-bar value that turns the PMOS transistors 308, 310 ON will hold the NMOS transistors 312, 314 OFF, and vice versa. The data-bar value at node 318 is also the output-bar value Q_b at the output node (inverse output node) 324, and similarly, the data value D at node 313 is the same value as the output value Q at output node 326.

If the data-bar value turns on the PMOS transistors 308, 310, the node 326 will be coupled to power high (Vdd) through the PMOS transistors, providing a HIGH value at node 326. If the data-bar value turns the NMOS transistors 312, 314 ON, the node 326 (output Q) will be coupled to ground through the NMOS transistors, providing a LOW value at node 326. The designations "HIGH" and "LOW" may indicate either a digital "1" or digital "0" according to the conventions of the circuit, as would be understood by one of skill in the art of digital circuit design.

The value at node 326 is coupled to the gates of the transistors 328, 330, 332, 334 of the second inverter 306, holding node 324 (output Q-bar) to the opposite digital data value of node 326. Thus, if output value Q is upset by a single event, it is restored to its original value by the output value Q_b in the second inverter.

Each of the storage transistors 308, 310, 312, 314 is fabricated in its own corresponding well 336, 338, 340, 342, and each of these wells have their own well taps 337, 339, 341, 343. Each well 336, 338, 340, 342 has at least one P-N junction between it and each other well in the memory cell 302. The transistors 328, 330, 332, 334 similarly have individual wells 350, 352, 354, 356 with similarly individual well taps.

If an upset event, such as a high-energy ion, creates charge in a well, the corresponding well tap draws the charge out of the well, and the P-N junction between wells prevents the generated charge from affecting another well. In other words, the charge created by upset event is confined to a single well until dissipated. The use of two PMOS transistors 308, 310 in series when the data state turns on the PMOS transistors 308, 310 (and the use of the corresponding two NMOS transistors 312, 314 for the opposite data state) holds the output Q to the correct value even when an upset event occurs at one of the PMOS transistors 308, 310.

For example, the well tap 337 of PMOS transistor 308 is coupled to Vdd. If an upset event occurs at PMOS transistor 308, the generated charge is dissipated by Vdd. If the PMOS transistors 308, 310 are held ON by Q_b, the well 339 of PMOS transistor 310 is coupled to Vdd through PMOS transistor 308. Charge generated by an upset event occurring at PMOS transistor 310 is dissipated by Vdd through PMOS transistor 308. The charge developed by the upset event at PMOS transistor 310 does not affect the operation of series PMOS transistor 308 because the P-N junction between wells 337 and 339 prevents charge generated by the upset event from flowing between well 338 and 336. The series PMOS transistor 308 maintains the conductive state to dissipate the charge in well 338 to Vdd.

The address transistors 305, 309 are fabricated in separate wells 307, 311, each of which is separate from the wells of the other transistors in the inverter 304. Similarly, address transistors 320, 323 are also fabricated in address wells 321, 329 that are separate from the wells of the other transistors in the memory cell. The wells 350, 352, 354, 356 form at least one P-N junction between each address transistor (e.g., between address transistor 305 and address transistor 309) and each other transistor in the memory cell. The P-N junction keeps charge generated by an upset event at one of the address transistors within the well of that address transistor until the generated charge is dissipated. Having the address transistors 305, 309 in series maintains the conduction state (i.e., ON or OFF) between the DATA input D and the internal node Q (or between DATA-bar and Q-bar) even if an upset event alters the conduction state of one of the address transistors.

The well 307 of the first address transistor 305 is coupled to an intermediate node 315 on the DATA input line between the first address transistor 305 and the second address transistor 309. The first address transistor well 307 is tapped back to the node 325, which is a lower voltage than at DATA input 313. This prevents an upset event from turning on the address path (i.e., both pass transistors 305, 309) by isolating the charge collected into a single well, where it affects a single device. The series address transistors 320, 323 on the DATA-bar input line are similarly coupled and operate in a similar fashion.

An upset to either of the address transistors 305, 309, in effect activates it similarly to a Q-write operation. However, the first pass transistor 305 is back-strapped to the lower-voltage node 325, and it is unlikely that a single upset event will turn on both pass transistors simultaneously. If DATA and DATA-bar are held at ±½ Vdd (typically), then an upset event at either address transistor will not upset the data value of the memory cell, even if the memory cell is a non-restoring memory cell (see, e.g., FIG. 3C).

The NMOS transistors 312, 314 in the first inverter 304 operate in a similar fashion when the NMOS transistors are held ON by Q_b. The operation of the second inverter 306 in response to an upset event(s) is also similar. Therefore, a detailed description of each pair of series transistors is omitted.

The wells 336, 338, 340, 342 are fabricated using techniques commonly known as triple-well techniques. Many CMOS ICs use what is commonly known as a double-well technique, in which both N-wells and P-wells are formed in a semiconductor substrate (e.g., a silicon wafer). An example of a triple-well technique forms an N-well, a P-well, and a P-well inside an N-tub. An alternative example uses an N-well, a P-well, and an N-well inside a P-tub.

The term "triple-well" is used herein to generally describe well techniques using one or more tubs to electrically isolate the well portions of transistors from each other by forming intervening P-N junctions that block charge flow generated in a first well region from entering a second, typically adjacent, well region. In a particular embodiment, an IC having a memory cell uses both a P-well in an N-type tub and an N-well in a P-type tub. Such embodiments will also be referred to as using "triple-well" techniques.

FIG. 3C is a layout of an RAM-type memory cell 360 according to an embodiment of the invention. The memory cell 360 is similar to what is commonly referred to as a "six-transistor memory cell". A six transistor memory cell has two address transistors, and four data-storage transistors (i.e., the address transistors are included in the transistor count).

The memory cell 360 includes address circuits 303, 362 and data storage circuit 364. The data storage circuit 364 uses cross-coupled CMOS pairs, as is well understood in the art of RAM-type memory. Data values (both input and output) Q and Q-bar are coupled into and out of the data storage circuit 364 through the address circuits 303, 362. The operation of address circuit 303 is explained above in reference to FIG. 3A, and a detailed description in reference to FIG. 3C is therefore omitted.

In a particular embodiment, the memory cell 360 is operated using bitlines 368, 370 and a wordline 372, as is known in the art of RAM-type memory. The serial address transistors 305, 309 in address circuit 303 provide improved SEU tolerance to the memory cell 360, even though the data storage circuit 364 is a not a self-restoring circuit. For purposes of discussion, bitline 368 will be referred to as an "inverse bitline", to which the inverse data value Q-bar is coupled.

An Exemplary Triple-Well Device

Figure 4:
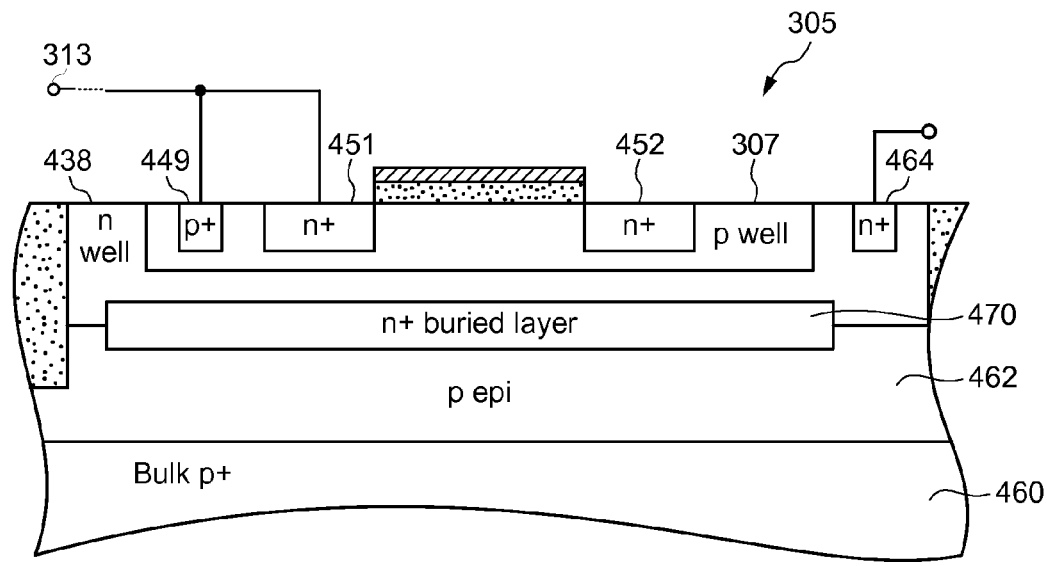
FIG. 4 shows a cross-section of a shielded NMOS device illustrating multiple wells used in a memory cell in accordance with an embodiment.

FIG. 4 shows a cross-section of a shielded NMOS device 305 illustrating multiple wells used in an address circuit of a memory cell in accordance with an embodiment. A shielded device is a device that is in its own well with its own tap, that is, no other devices (e.g., FETs) share that well. A similar shielded PMOS structure is known in the art, as are unshielded NMOS and PMOS triple well devices. Various combinations of shielded and unshielded triple-well techniques are used in various embodiments. The cross-section represents a section of NMOS transistor 305, which is formed in P-well 307. A P-well tap 449 is coupled to intermediate node 315 (see FIG. 3A, 3B,) as is the drain terminal 451. The source terminal 452 is coupled to the input (e.g., input node 313 in FIG. 3A). The second series address transistor (see, e.g., FIG. 3A, 3B, ref. nums. 309) is also fabricated in a separate well according to these or other suitable techniques, with connections as shown therein.

A $P^+$-type substrate 460 is used in this example, but an $N^+$-type substrate is alternatively used with appropriate modification of the well and tub conductivity (doping) types. A $P^+$-type substrate is also used in alternative embodiments of shielded or unshielded triple-well PMOS structures.

N-well 438, also known as an N-type tub, is formed substantially over a P-type epitaxial layer 462 and incorporates an $N^+$ buried layer 470. An N-well tap (N-type tub tap) 464 is coupled to a positive voltage, such as Vdd. The N-well tub is not shown in FIG. 3A or 3B for simplicity and clarity of illustration. Generally, the NMOS transistor 305 of FIG. 3A is formed in a first P-well 307 within a first N-type tub, which forms a P-N junction (not separately shown) between the N-well 438 and the P-well 307. The P-N junction blocks current flow from the P-well into the bulk silicon 460. The N-well 438 is also referred to as a tub, which isolates the bulk silicon from the transistor, and the transistor from the other transistors in the memory cell. Triple-well techniques are generally disfavored for CMOS ICs due to the extra process steps, additional mask, and slow device response (speed); however, triple-well techniques used in memory cells according to embodiments provide single-event upset tolerance, even with closely spaced nodes. The slower device speed arising from triple-well shielding is acceptable in memory cell applications, whereas it would be generally in more speed-critical applications.

An Exemplary CMOS Triple-Well Structure

Figure 5:
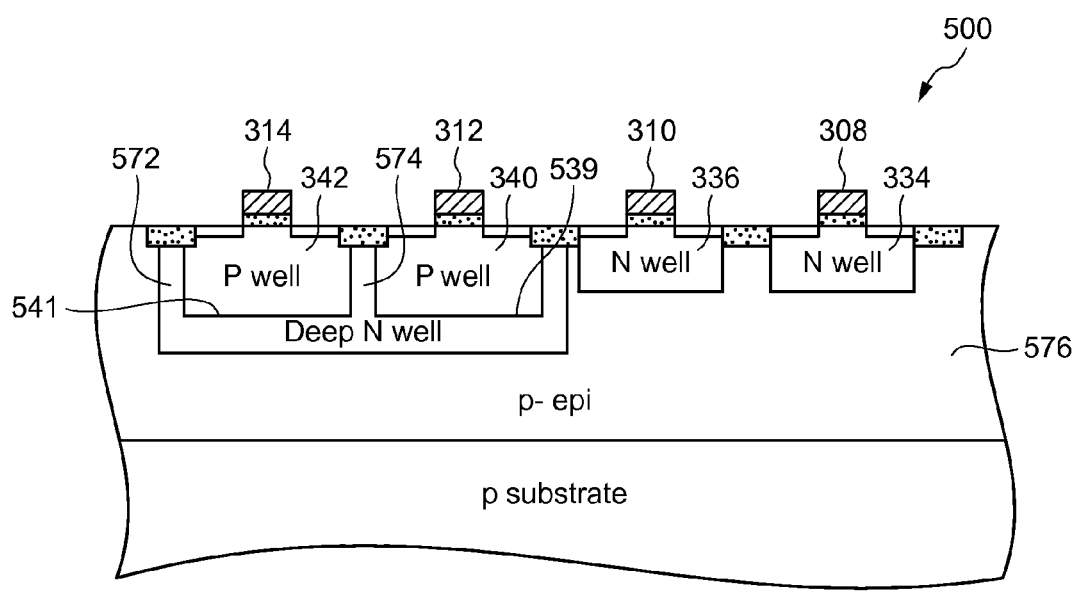
FIG. 5 is a cross section of a CMOS portion of a memory cell according to an embodiment.

FIG. 5 is a cross section of a CMOS portion of a memory cell 500 according to an embodiment. Two NMOS transistors 312, 314 are formed in separate P wells 340, 343 inside N-type tubs 539, 541 formed from a deep N-well structure 572 and sharing an intervening N-type separator 574 between the P-well 340 and the P-well 342. Alternatively, two completely separate N-type tubs are formed and P-wells are formed within the completely separate tubs. The deep N-well structure has a tap (not shown, see FIG. 4, ref. num. 464). Embodiments having two completely separate deep N-wells (tubs) have separate associated taps. The separate biasing of the N-type tub(s) and P-wells forms a P-N junction between the well and the tub so that charge formed in the well does not flow into the body of the wafer, but rather is dissipated through the well tap. The substrate is also typically biased, which forms another P-N junction between the P-type epitaxial layer 576 and the N-type tub(s).

The CMOS cross section 500 also shows two PMOS devices 308, 310 having separate N-wells 336, 338. P-N junctions form between the N-wells 308, 310 and the P-type epitaxial material 576. Each well 336, 338, 340, 342 is electrically isolated from each other well and from the epitaxial semiconductor layer and bulk semiconductor by at least one P-N junction that confines charge generated in that well by a high-energy particle to be dissipated through an associated well tap. As used herein, "isolated" means wells are isolated from each other within the wafer so that current does not flow between them. In practice, the wells may be electrically coupled to a similar current source or sink through their well taps.

Dissipation through the well tap connections avoids accumulating charge in the native epitaxial layer or bulk semiconductor, which might otherwise affect adjacent transistors and cause a data upset event from a high-energy particle. No transistor in the memory cell shares a well with any other transistor in the memory cell. In alternative embodiments, some transistors, such as access transistors, share wells with other access transistors not associated with the same memory cell.

Figure 6:
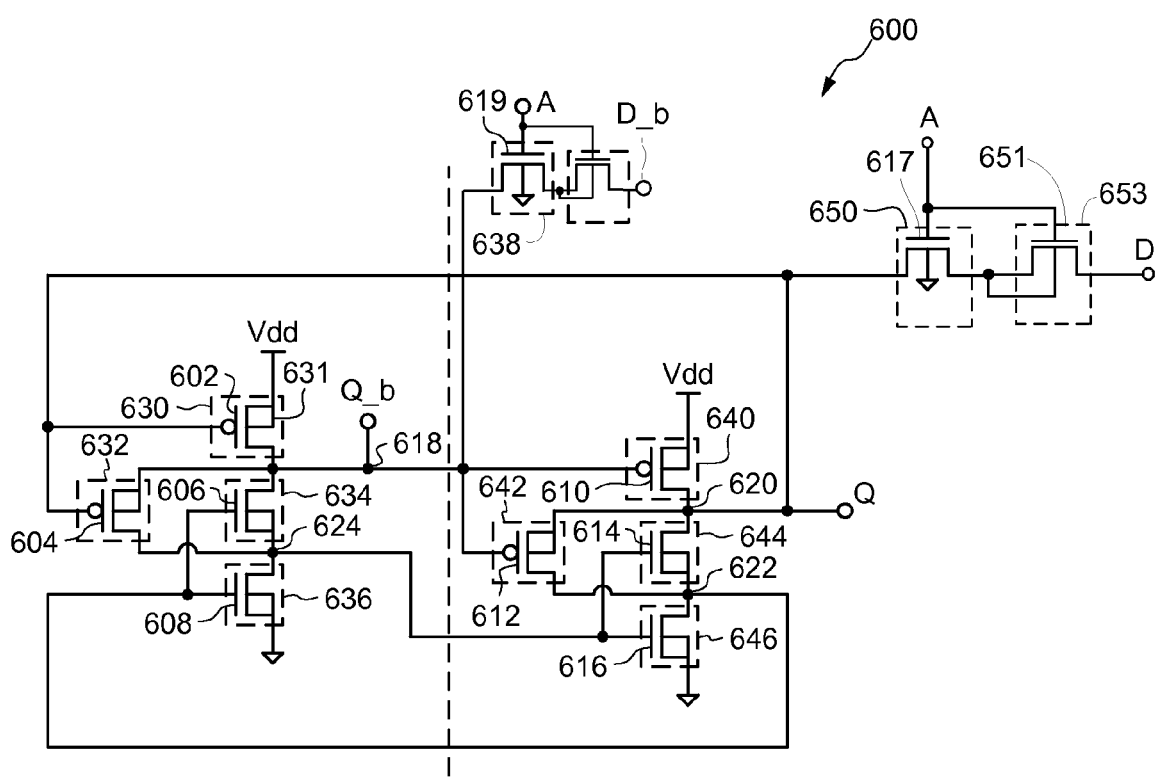
FIG. 6 is a layout of an SEU tolerant memory cell according to another embodiment of the invention.

FIG. 6 is a layout of an SEU tolerant memory cell 600 according to another embodiment of the invention. The memory cell 600 is essentially similar to the memory cell of FIG. 3B in that the memory cell 600 has a plurality of transistors coupled to restore a data value to a node of the memory cell to an initial value following an event upsetting the initial value. Basically, NMOS devices are in parallel with PMOS devices, rather than having the NMOS devices and PMOS devices in series. Isolated wells 630, 632, 634, 636, 638, 640, 642, 644, 646, 648 for each of the transistors 602, 604, 606, 608, 610, 612, 614, 616, 617, 619 are provided using triple-well techniques, as described above in reference to FIGS. 4 and 5. Each well has a well tap (e.g., well tap, the other well taps are shown without reference numerals for clarity of illustration) coupled to a current source or sink to dissipate charge formed in the well upon impact of an energetic particle.

Node 618 does not collect charge from an upset event because of the zero voltage (i.e., connection) between the drain of NMOS transistor 606 and its well, and similarly between the source of PMOS transistor 604 and its well. The same occurs for node 620 due to the biasing and well isolation of transistors 612 and 614. The wells for transistors 604, 606, 612, 614 are isolated from the wells of each other transistor in the memory cell 600 by at least one P-N junction.

In operation, a data value D that turns PMOS transistors 602, 604 OFF is simultaneously provided with a data-bar value D_b that turns PMOS transistors 610, 612 ON (and vice versa). Turning PMOS transistors 610 and 6120N couples Vdd to node 620 through PMOS transistor 610 and also couples node 622 to Vdd through PMOS transistor 612. Coupling Vdd to node 622 turns NMOS transistors 606 and 608 ON, which couples nodes 624 and 618 to ground. Thus, Q_b is essentially at ground potential, and Q is essentially at Vdd.

The DATA input D is coupled to node Q through address transistors 617, 651 when the address signal A is active. DATA-bar D_b is similarly coupled to node 618 when the address signal A is active. Address transistors 617, 651 are fabricated in separate wells 650, 653, which provide a P-N junction between them that isolates one address transistor from the other, should a SEU occur. The well 653 of the first address transistor 651 is coupled to a node on the DATA input line between the first address transistor 651 and the second address transistor 617. The well 653 is tapped back to the lower voltage node (i.e., lower than the potential at the DATA node D), as described above in reference to FIGS. 3A and 3B.

Figure 7:
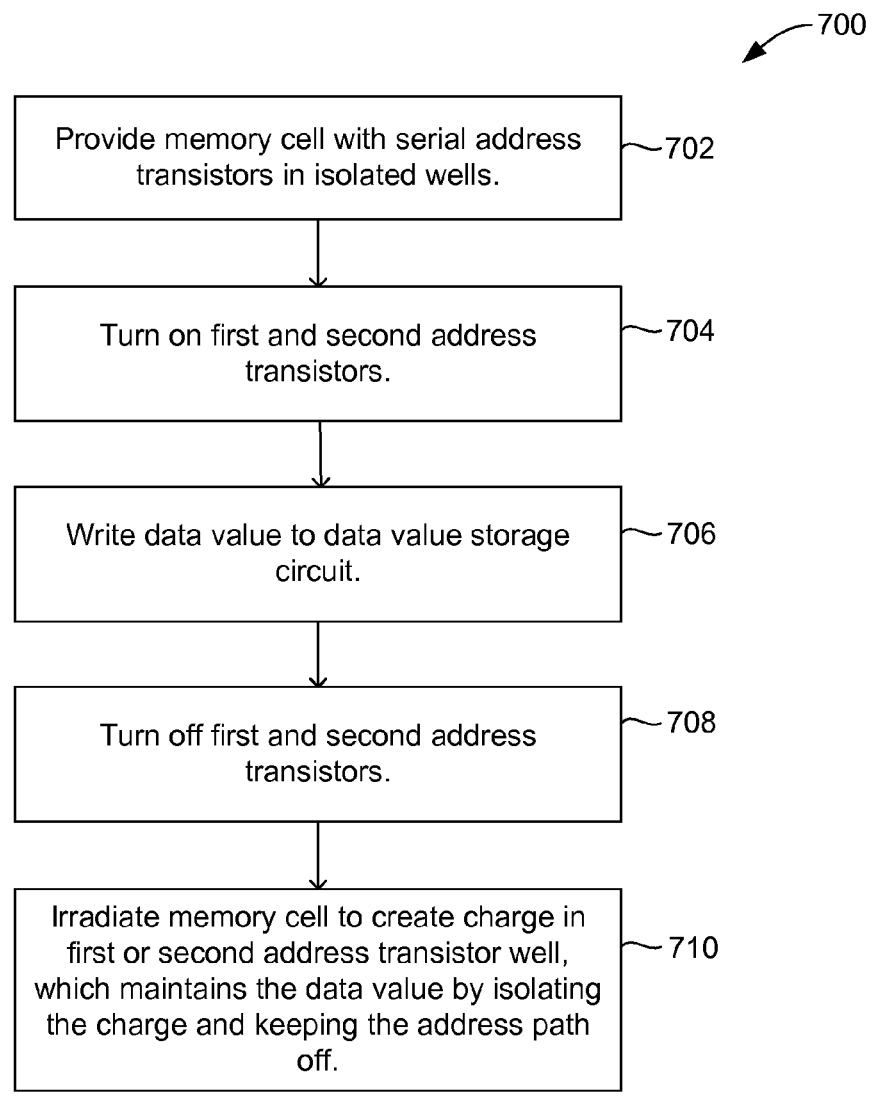
FIG. 7 is a flow chart of a method of operating a memory cell in accordance with an embodiment.

FIG. 7 is a flow chart of a method 700 of operating a memory cell in accordance with an embodiment. A memory cell having an address circuit including a first address transistor in a first address transistor well and a second address transistor in a second address transistor well in series between a data node and a data value storage circuit wherein the first address transistor well is coupled to an intermediate node between the first address transistor and the second transistor and the second address transistor well is coupled to a ground terminal is provided (step 702). The first and second address transistors are turned on by an address control signal (step 704) and a data value is written to the data value storage circuit (step 706). The first and second address transistors are turned off (step 708). The memory cell is exposed to ionizing radiation so as to create charge in one of the first address transistor well and the second address transistor well (step 710), the charge being isolated to one of the first address transistor well or the second address transistor well so as to not disturb the data value.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A memory cell, comprising:
a data node;
a data value storage circuit;
a data address circuit including a first address transistor formed in a first address transistor well and a second address transistor formed in a second address transistor well, wherein:
the first address transistor is coupled between the data node and the second address transistor,
the second address transistor is coupled between the first address transistor and the data value storage circuit,
each of the first address transistor and the second address transistor are controlled by an address control line,
the first address transistor well is coupled to an intermediate node between the first address transistor and the second address transistor, and
the second address transistor well is coupled to a ground terminal.

2. The memory cell of claim 1, wherein the data value storage circuit is a self-correcting data storage circuit.

3. The memory cell of claim 1, wherein the data value storage circuit includes a first CMOS pair cross-coupled with a second CMOS pair.

4. The memory cell of claim 1, wherein the address control line is a word line of a memory array.

5. The memory cell of claim 1, further comprising an output node, the data value storage circuit being disposed between the output node and the data address circuit.

6. The memory cell of claim 1, further comprising
an inverse node; and
a second data address circuit including a third address transistor formed in a third address transistor well and a fourth address transistor formed in a fourth address transistor well, wherein:
the third address transistor is coupled between the inverse node and the fourth address transistor, and
the fourth address transistor is coupled between the third address transistor and the data value storage circuit,
each of the third address transistor and the fourth address transistor is controlled by the address control line,
the third address transistor well is coupled to a second intermediate node between the third address transistor and the fourth address transistor, and
the fourth address transistor well is coupled to a ground terminal.

7. The memory cell of claim 6, wherein the data node is coupled to a bitline of a memory array and the inverse node is coupled to an inverse bitline of the memory array.

8. The memory cell of claim 6, wherein:
the data node is a data input node and the inverse node is an inverse input node, and
the memory cell further comprises a data output node coupled to the data value storage circuit and an inverse output node coupled to the data value storage circuit, wherein:
the data output node provides a data value stored in the data value storage circuit, and
the inverse output node provides an inverse data value stored in the data value storage circuit.

9. The memory cell of claim 8, wherein the data value storage circuit is a self-correcting data storage circuit.

10. The memory cell of claim 9, wherein the self-correcting data storage circuit restores the data value after a single-event upset.

11. The memory cell of claim 9, wherein the self-correcting data storage circuit includes a plurality of transistors coupled to restore the data value to the data output node of the memory cell to an initial value following an event upsetting the initial value, the plurality of transistors including at least:
a first transistor of a first type in a first well of a second type having a first well tap;
a second transistor of the first type in a second well of the second type having a second well tap;
a third transistor of the second type in a third well of the first type having a third well tap; and
a fourth transistor of the second type in a fourth well of the first type having a fourth well tap,
wherein the first well, second well, third well, and fourth well are isolated from each other.

12. The memory cell of claim 11, further comprising:
a fifth transistor of the first type in a fifth well of the second type having a fifth well tap;
a sixth transistor of the first type in a sixth well of the second type having a sixth well tap;
a seventh storage transistor of the second type in a seventh well of the first type having a seventh well tap; and
an eighth storage transistor of the second type in an eighth well of the first type having an eighth well tap,
wherein the fifth well, sixth well, seventh well and eighth well are isolated from each other and from each of the first well, the second well, the third well and the fourth well.

13. The memory cell of claim 12, wherein:
the first transistor, the second transistor, the third transistor, and the fourth transistor are coupled to operate as a first inverter circuit;
the fifth transistor, the sixth transistor, the seventh transistor, and the eighth transistor are coupled to operate as a second inverter circuit; and
the first inverter is cross-coupled to the second inverter so as to restore the data value to the node of the memory cell to the initial value following the event upsetting the initial value.

14. An integrated circuit including a memory cell in accordance with claim 1.

15. A field programmable gate array having a configuration memory including a memory cell in accordance with claim 1.

16. A method of operating a memory cell, comprising:
providing a memory cell having an address circuit, the address circuit including a first address transistor in a first address transistor well and a second address transistor in a second address transistor well, the first and second address transistors being coupled in series between a data node and a data value storage circuit;
wherein the first address transistor well is coupled to an intermediate node between the first address transistor and the second transistor, and the second address transistor well is coupled to a ground terminal;
turning on the first address transistor and the second address transistors;
writing a data value to the data value storage circuit;
turning off the first address transistor and second address transistors; and
exposing the memory cell to ionizing radiation so as to create charge in one of the first address transistor well or the second transistor well, the charge being isolated to one of the first address transistor well or the second address transistor well so as to not disturb the data value.

17. The method of claim 16, wherein:
the first address transistor is coupled between the data node and the second address transistor;
the second address transistor is coupled between the first address transistor and the data value storage circuit;
each of the first address transistor and the second address transistor are controlled by an address control line;
the first address transistor well is coupled to an intermediate node between the first address transistor and the second address transistor; and
the second address transistor well is coupled to a ground terminal.

18. The method of claim 16, wherein the charge is created in the first address transistor well and applied to the intermediate node so as to hold the second address transistor in a non-conductive state.

* * * * *